United States Patent
Hammond et al.

(10) Patent No.: US 12,198,908 B2
(45) Date of Patent: Jan. 14, 2025

(54) MAGNETICALLY COUPLED RF FILTER FOR SUBSTRATE PROCESSING CHAMBERS

(71) Applicant: Applied Materials, Inc., Santa Clara, CA (US)

(72) Inventors: Edward P. Hammond, Hillsborough, CA (US); Dmitry A. Dzilno, Sunnyvale, CA (US); Alexander V. Garachtchenko, Mountain View, CA (US)

(73) Assignee: Applied Materials, Inc., Santa Clara, CA (US)

( * ) Notice: Subject to any disclaimer, the term of this patent is extended or adjusted under 35 U.S.C. 154(b) by 549 days.

(21) Appl. No.: 17/317,880

(22) Filed: May 11, 2021

(65) Prior Publication Data

US 2022/0364233 A1    Nov. 17, 2022

(51) Int. Cl.
*H01J 37/32* (2006.01)
*C23C 16/455* (2006.01)
(Continued)

(52) U.S. Cl.
CPC .. *H01J 37/32724* (2013.01); *C23C 16/45536* (2013.01); *C23C 16/46* (2013.01);
(Continued)

(58) Field of Classification Search
CPC ............ C23C 16/45536; C23C 16/458; C23C 16/4586; C23C 16/46; C23C 16/505;
(Continued)

(56) References Cited

U.S. PATENT DOCUMENTS 5,392,018 A * 2/1995 Collins ............. H01J 37/32688
336/84 C
6,677,557 B2 * 1/2004 Ito ......................... H01L 23/345
219/465.1
(Continued)

FOREIGN PATENT DOCUMENTS

KR   10-2019-0011627 A    2/2019
TW       201620248 A      6/2016
WO       2020-096723 A1   5/2020

OTHER PUBLICATIONS

International Search Report and Written Opinion mailed on Aug. 31, 2022 in International Patent Application No. PCT/US2022/028706, 10 pages.

*Primary Examiner* — Benjamin Kendall
(74) *Attorney, Agent, or Firm* — Kilpatrick Townsend & Stockton LLP

(57) ABSTRACT

A semiconductor processing chamber for processing semiconductor substrates may include a pedestal to support a substrate with a heater zones and a wire mesh configured to deliver a Radio Frequency (RF) signal to a plasma. The chamber may also include heater zone controls that deliver current to the heater zones and a filter circuit between the heater zone controls and the heater zones. The filter circuit may include inductors on leads from the heater zones and a resonant circuit with a resonant inductor that is magnetically coupled to the lead inductors. The resonant circuit may produce a resonant peak that filters the RF signal delivered to the wire mesh from the leads from the heater zones to prevent the RF signal from reaching the heater zone controls.

7 Claims, 11 Drawing Sheets

(51) Int. Cl.
  *C23C 16/46*  (2006.01)
  *C23C 16/505*  (2006.01)
  *H01L 21/67*  (2006.01)

(52) U.S. Cl.
  CPC .......... *C23C 16/505* (2013.01); *H01J 37/321* (2013.01); *H01L 21/67103* (2013.01)

(58) Field of Classification Search
  CPC ....... C23C 16/509; C23C 16/52; C23C 16/54; H01J 37/321; H01J 37/32715; H01J 37/32724; H01L 21/67103
  See application file for complete search history.

(56) References Cited

U.S. PATENT DOCUMENTS

| | | | | |
|---|---|---|---|---|
| 7,173,219 | B2* | 2/2007 | Okajima | H05B 3/143 |
| | | | | 118/725 |
| 9,281,226 | B2* | 3/2016 | Makhratchev | B23K 10/00 |
| 2003/0094239 | A1 | 5/2003 | Quon et al. | |
| 2007/0284344 | A1* | 12/2007 | Todorov | H01J 37/32706 |
| | | | | 219/121.54 |
| 2008/0197780 | A1 | 8/2008 | Yamazawa | |
| 2016/0079038 | A1* | 3/2016 | Okunishi | H01J 37/32798 |
| | | | | 315/111.21 |
| 2017/0111025 | A1* | 4/2017 | Kapoor | H02M 1/44 |
| 2020/0126772 | A1* | 4/2020 | Nagashima | H05H 1/46 |
| 2020/0373125 | A1* | 11/2020 | Galstyan | H03H 7/0115 |
| 2021/0005434 | A1 | 1/2021 | Kim | |
| 2021/0366695 | A1* | 11/2021 | Galstyan | H01L 21/6831 |

* cited by examiner

MAGNETICALLY COUPLED RF FILTER FOR SUBSTRATE PROCESSING CHAMBERS

TECHNICAL FIELD

This disclosure generally relates to techniques for filtering RF signals from pedestal leads in a substrate processing chamber. More specifically, this disclosure describes a resonant inductor that is magnetically coupled to multiple inductors on multiple leads for heater zone controls in a pedestal of the processing chamber.

BACKGROUND

Semiconductor substrates may be processed in a processing chamber, where they may be subject to deposition, etch, and other processes performed in a controlled environment. A pedestal mounted in the chamber may provide support for a semiconductor substrate during processing operations. In some operations, a plasma may be formed from a gas that is supplied between the substrate and a target, thereby causing material to be deposited on the substrate as a film. Radio Frequency (RF) power may be provided to the plasma through a wire mesh embedded in the pedestal. The pedestal may also include a resistive heater such that the temperature of the substrate can be tightly controlled as the substrate is processed.

SUMMARY

In some embodiments, a semiconductor processing chamber for processing semiconductor substrates may include a pedestal to support a substrate, where the pedestal may include a plurality of heater zones to heat the substrate and a wire mesh configured to deliver a Radio Frequency (RF) signal to a plasma in the processing chamber with the substrate. The processing chamber may also include one or more heater zone controls configured to deliver current to the plurality of heater zones, and a filter circuit between the one or more heater zone controls and the plurality of heater zones. The filter circuit may include a plurality of inductors on a plurality of leads from the plurality of heater zones and a resonant circuit comprising a resonant inductor that is magnetically coupled to the plurality of inductors. The resonant circuit may produce a resonant peak that filters the RF signal delivered to the wire mesh from the plurality of leads from the plurality of heater zones to prevent the RF signal from reaching the one or more heater zone controls.

In some embodiments, a filter circuit for a semiconductor processing chamber may include a first lead corresponding to a first heater zone in a pedestal of the semiconductor processing chamber; a first inductor connected to the first lead; and a resonant inductor that is magnetically coupled to the first inductor, where the filter circuit may produce a resonant peak corresponding to a frequency of an RF signal that is provided to a plasma in the semiconductor processing chamber.

In some embodiments, a method of filtering plasma RF signals from heater zone leads in a semiconductor processing chamber for processing semiconductor substrates may include receiving an RF signal on a lead from a heater zone in a pedestal supporting a substrate in a processing chamber, where the RF signal may be delivered to an electrode in the pedestal and leaked onto the lead from the heater zone. The method may also include generating a resonant peak using an inductor on the lead from the heater zone that is magnetically coupled to a resonant inductor to produce the resonant peak. The method may additionally include filtering the RF signal with the resonant peak to prevent the RF signal from reaching a heater zone control corresponding to the heater zone.

In any embodiments, any and all of the following features may be implemented in any combination and without limitation. The resonant circuit may also include a resonant capacitor in series with the resonant inductor that contributes to producing the resonant peak. The plurality of heater zones may include at least seven heater zones in the pedestal, where the at least seven heater zones may include four heater zones around a perimeter of the pedestal and three concentric heater zones radiating from a center of the pedestal. The plurality of leads from the plurality of heater zones may include at least nine leads, a first lead in the at least nine leads may correspond to a first return lead shared by the four heater zones around the perimeter of the pedestal, and a second lead in the at least nine leads may correspond to a second return lead shared by the three concentric heater zones radiating from the center of the pedestal. The filter circuit may be part of a filter box that also receives the RF signal from one or more RF generators and provides the RF signal to the wire mesh. The plurality of inductors and the resonant inductor may be enclosed in the filter box. The resonant inductor may be magnetically coupled to each of the plurality of inductors individually such that the resonant circuit may produce the resonant peak for each of the plurality of leads from the plurality of heater zones. The filter circuit may also include a second lead corresponding to a second heater zone in the pedestal, and a second inductor connected to the second lead, where the resonant inductor may also be magnetically coupled to the second inductor. The filter circuit may also include a first capacitor connected to the first lead and a resonant capacitor connected in series with the resonant inductor, where the first inductor, the first capacitor, the resonant inductor, and the resonant capacitor may combine to produce the resonant peak. The filter circuit may also include a magnetic core, where the first inductor and the resonant inductor may be wound around the magnetic core. The magnetic core may include a straight ferrite rod. The magnetic core may also include a toroid ring. The filter circuit may also include a second inductor connected in series with the first inductor to the first lead and a second resonant inductor that may be magnetically coupled to the second inductor, where the filter circuit may produce a second resonant peak corresponding to a second frequency of the RF signal that may be provided to the plasma in the semiconductor processing chamber. The filter circuit may also include a ferrite toroid magnetic core, where the first inductor and the resonant inductor may be wound around the ferrite toroid magnetic core; a first capacitor connected in series with the first inductor and in parallel with a second lead corresponding to a first-tier zone control; and a printed circuit board, where the first inductor and the ferrite toroid magnetic core may be wired to the printed circuit board with a connection to the first capacitor. The method may include magnetically coupling the resonant inductor to a plurality of inductors, where the plurality of inductors may be connected to leads from other heater zones in the pedestal. The inductor on the lead from the heater zone, the plurality of inductors, and the resonant inductor may share a same magnetic core. Generating the resonant peak may include using a resonant capacitor connected in series with the resonant inductor, wherein the resonant capacitor and the resonant inductor are not connected to the inductor on the lead from the heater zone. Current may be provided to the heater zone in the pedestal using the heater zone control.

BRIEF DESCRIPTION OF THE DRAWINGS

A further understanding of the nature and advantages of various embodiments may be realized by reference to the remaining portions of the specification and the drawings, wherein like reference numerals are used throughout the several drawings to refer to similar components. In some instances, a sub-label is associated with a reference numeral to denote one of multiple similar components. When reference is made to a reference numeral without specification to an existing sub-label, it is intended to refer to all such multiple similar components.

DETAILED DESCRIPTION

A pedestal in a semiconductor processing chamber may include components for delivering RF power to a plasma, as well as components for controlling the temperature of the substrate. An RF generator may send RF power through a lead to a wire mesh embedded in the pedestal supporting a substrate in the chamber. This RF power may be propagated through a gas above the substrate to form and control a plasma in the chamber for depositing material on the substrate. Additionally, a high-voltage heater control may transmit current through a lead to resistive heaters embedded in the pedestal to heat the substrate to a controlled temperature during the process. In order to maximize the amount of RF power that is transmitted to the plasma, the leads from the RF generator and the heater control may run through a filter box to minimize the RF power that leaks back through the heater leads rather than being transmitted to the plasma. While these filter circuits are fairly simple for one or two heater zones, they become more complex as the number of heater zones are increased. Specifically, the large inductors used to filter each lead quickly fill the physical volume of the filter box as the number of leads is increased.

In order to accommodate a growing number of heater zones in the pedestal, some embodiments decrease the volume used by the filter inductors in the filter box. Specifically, a resonant circuit comprising a resonant inductor and a resonant capacitor may allow the inductors on the leads from the heater zones to be much smaller. The resonant inductor may be magnetically coupled to the inductors on the leads from the heater zones. In effect, this allows multiple lead inductors to "share" the inductance on the resonant inductor, thereby allowing each individual lead inductor to be much smaller. Some embodiments may use a magnetic core, such as a ferrite rod or toroid that may be shared between the lead inductors and the resonant inductor. Multiple resonant circuits may be added to generate multiple filtering frequencies, thereby allowing any RF transients to be filtered from the heater leads while minimizing the space used in the filter box.

Figure 1A:
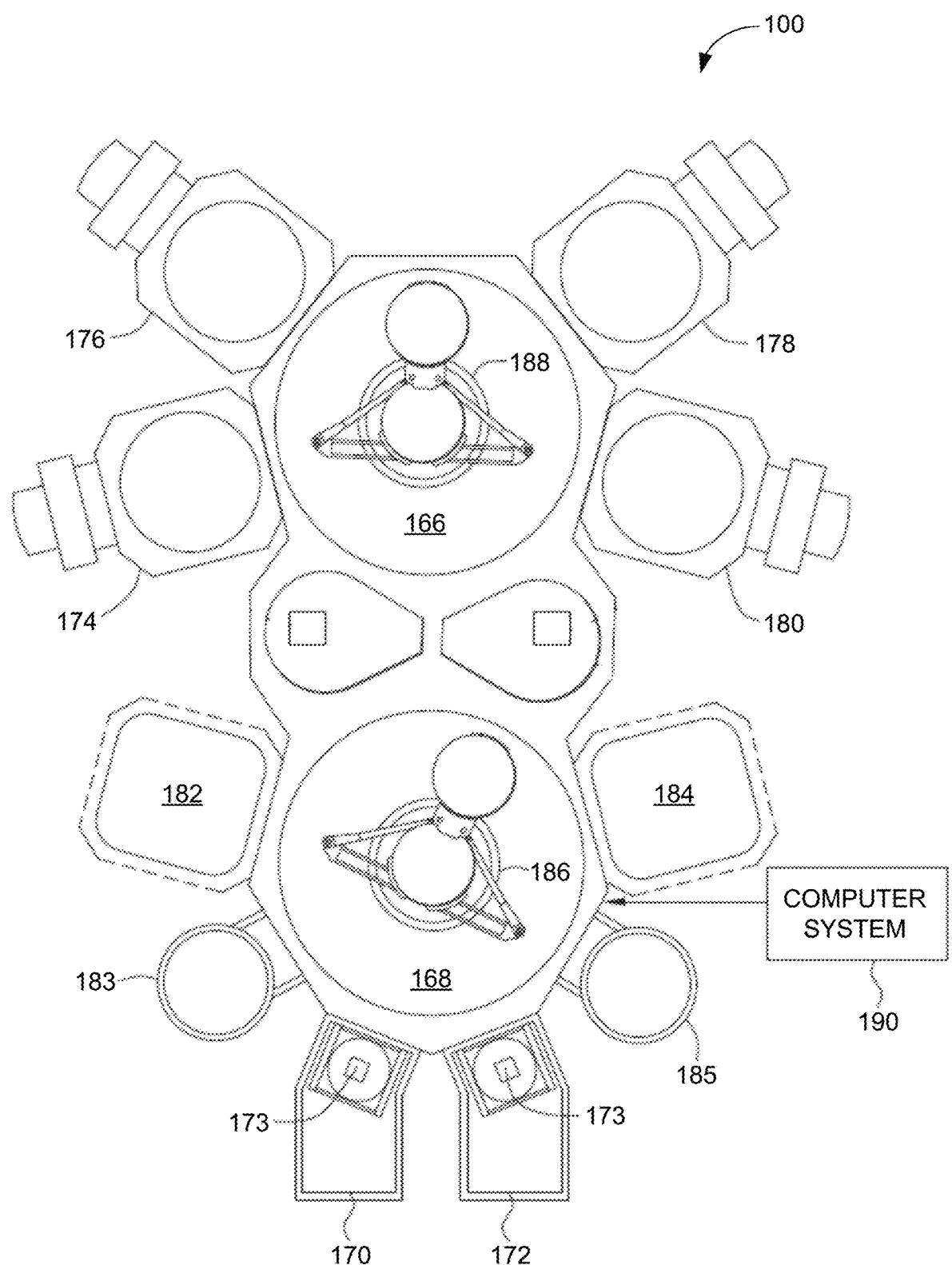
FIG. 1A illustrates a top plan view of a multi-chamber processing system that may be configured to implement some embodiments described herein.

FIG. 1A illustrates a top plan view of a multi-chamber processing system 100 that may be configured to implement some embodiments described herein. The multi-chamber processing system 100 may be configured to perform one or more fabrication processes on individual substrates, such as silicon wafers, for forming semiconductor devices. The multi-chamber processing system 100 may include some or all of a transfer chamber 166, a buffer chamber 168, single wafer load locks 170 and 172, processing chambers 174, 176, 178, 180, 182, and 184, preheating chambers 183 and 185, and robots 186 and 188. The single wafer load locks 170 and 172 may include heating elements 173 and may be attached to the buffer chamber 168. The processing chambers 174, 176, 178, and 180 may be attached to the transfer chamber 166. The processing chambers 182 and 184 may be attached to the buffer chamber 168. The operation of the multi-chamber processing system 100 may be controlled by a computer system 190. The computer system 190 may include any device or combination of devices configured to implement the operations described herein. As such, the computer system 190 may be a controller or array of controllers and/or a general purpose computer configured with software stored on a non-transitory, computer-readable medium that, when executed, performs the operations described herein. One example of a suitable multi-chamber processing system 100 is the Endura® CL System manufactured by Applied Materials, Inc. of Santa Clara, California.

Each of the processing chambers 174, 176, 178, 180, 182, and 184 may be configured to perform one or more process steps in the fabrication of a conductive structure in a semiconductor device, such as a contact structure for a field-effect transistor (FET). More specifically, the processing chambers 174, 176, 178, 180, 182, and 184 may include one or more metal deposition chambers, surface cleaning and preparation chambers, thermal anneal and/or thermal hydrogenation chambers, and plasma hydrogenation/nitridization chambers.

Figure 1B:
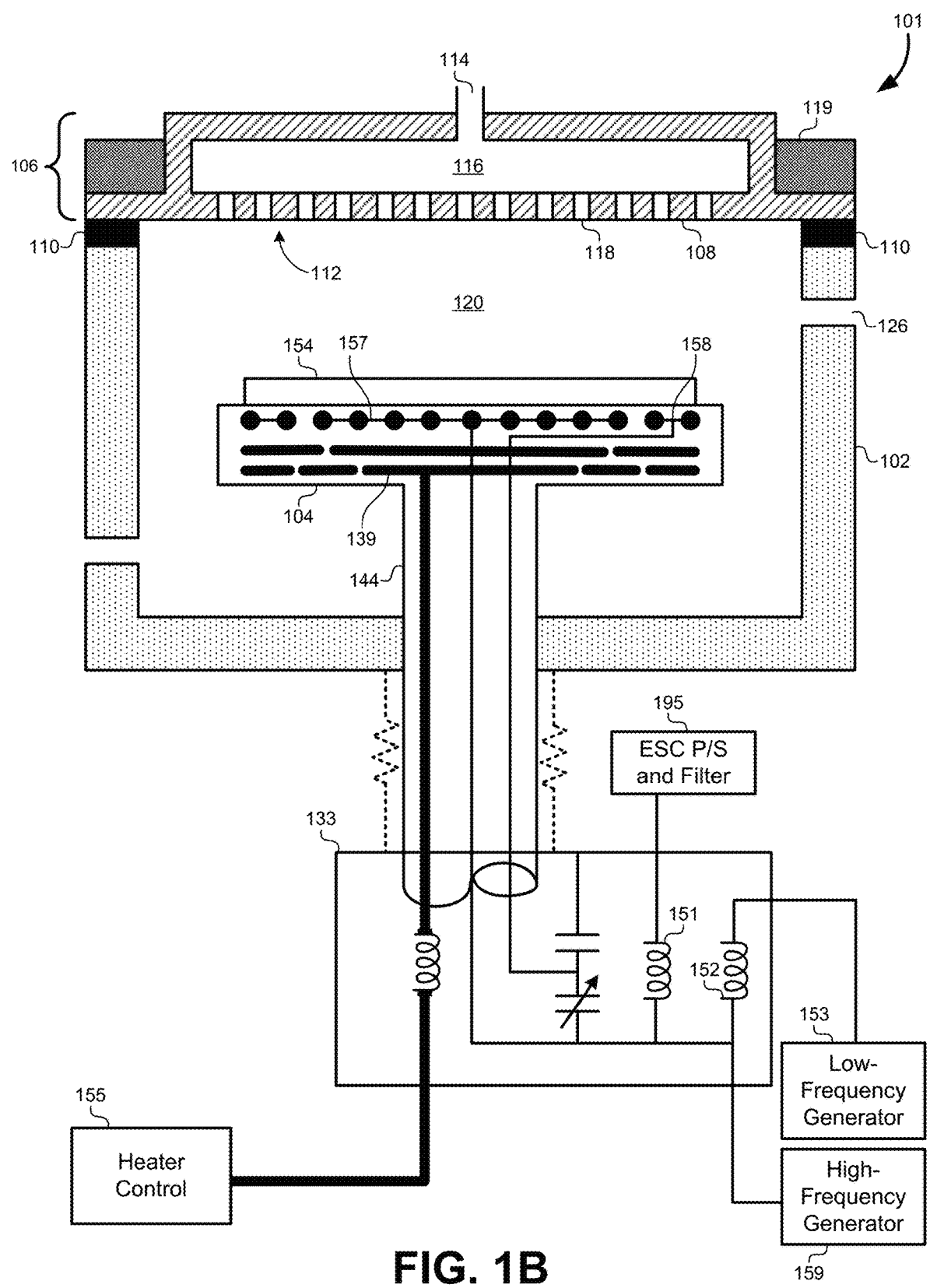
FIG. 1B illustrates a cross-sectional view of a wafer-processing chamber, according to some embodiments.

FIG. 1B illustrates a cross-sectional view of a wafer-processing chamber 101, according to some embodiments. As shown, the processing chamber 100 may be an etch chamber suitable for etching a substrate 154 or for performing other wafer manufacturing operations. Examples of processing chambers that may be adapted to benefit from the embodiments describe herein may include the Producer® Etch Processing Chamber, and the Precision™ Processing Chamber, commercially available from Applied Materials, Inc., located in Santa Clara, California. It is contemplated that other processing chambers, including those from other manufacturers, may be adapted to benefit from these embodiments.

The processing chamber 100 may be used for various plasma processes. For example, the processing chamber 100 may be used to perform dry etching with one or more etching agents. The processing chamber may be used for ignition of plasma from a precursor $C_xF_y$ (where x and y represent values for known compounds), $O_2$, $NF_3$, or combinations thereof. In another example, the processing chamber 100 may be used for a plasma-enhanced chemical vapor deposition (PECVD) process with one or more precursors.

The processing chamber 100 may include a chamber body 102, a lid assembly 106, and a pedestal 104. The lid assembly 106 is positioned at an upper end of the chamber body 102. The pedestal 104 may be disposed inside the chamber body 102, and the lid assembly 106 may be coupled to the chamber body 102 and enclose the pedestal 104 in a processing volume 120. The chamber body 102 may include a transfer port 126, which may include a slit valve, formed in a sidewall of the chamber body 102. The transfer port 126 may be selectively opened and closed to allow access to an interior of the processing volume 120 by a substrate handling robot (not shown) for substrate transfer.

An electrode 108 may be provided as a portion of the lid assembly 106. The electrode 108 may also function as a gas distributor plate 112 having a plurality of openings 118 for admitting process gas into the processing volume 120. The process gases may be supplied to the processing chamber 100 via a conduit 114, and the process gases may enter a gas mixing region 116 prior to flowing through the openings 118. The electrode 108 may be coupled to a source of electric power, such as an RF generator, DC power, pulsed DC power, pulsed RF, and/or the like. An isolator 110 may contact the electrode 108 and separate the electrode 108 electrically and thermally from the chamber body 102. The isolator 110 may be constructed using a dielectric material such aluminum oxide, aluminum nitride, and/or other ceramics or metal oxides. A heater 119 may be coupled to the gas distributor plate 112. The heater 119 may also be coupled to an AC power source.

The pedestal 104 may be coupled to a lift mechanism through a shaft 144, which extends through a bottom surface of the chamber body 102. The lift mechanism may be flexibly sealed to the chamber body 102 by a bellows that prevents vacuum leakage from around the shaft 144. The lift mechanism may allow the pedestal 104 to be moved vertically within the chamber body 102 between a transfer position and a number of process positions to place the substrate 154 in proximity to the electrode 108.

The pedestal 104 may be formed from a metallic or ceramic material. For example, a metal oxide, nitride, or oxide/nitride mixture may be used such as aluminum, aluminum oxide, aluminum nitride, an aluminum oxide/nitride mixture, and/or other similar materials. In typical implementations, one or more pedestal electrodes may be included in the pedestal 104. For example, a first pedestal electrode 157 and a second pedestal electrode 158 may be provided in the pedestal 104. The first pedestal electrode 157 and the second pedestal electrode 158 may be embedded within the pedestal 104 and/or coupled to a surface of the pedestal 104. The first pedestal electrode 157 and the second pedestal electrode 158 may be a plate, a perforated plate, a mesh, a wire screen, or any other distributed conductive arrangement. Although FIG. 1 illustrates only two pedestal electrodes, other embodiments may use more than two pedestal electrodes having different geometries and/or arrangements in the pedestal 104 as described in detail below.

A method known as bipolar chucking may be used with a first pedestal electrode 157 and a second pedestal electrode 158. Bipolar chucking is a method of applying a DC voltage difference between the first pedestal electrode 157 and the second pedestal electrode 158. This electrostatic difference serves to hold the substrate 154 to the pedestal 104. This may be contrasted with monopolar chucking where only a single pedestal electrode is used, or where a DC voltage is only applied to a single pedestal electrode. Monopolar chucking only becomes effective when energy is applied to the plasma to complete the circuit. Bipolar chucking uses two separate electrical paths to each of the first pedestal electrode 157 and the second pedestal electrode 158. In the example of FIG. 1A, a first DC voltage source may be applied to a first electrical pathway for the first pedestal electrode 157. A second DC voltage source may be applied to a second electrical pathway for the second pedestal electrode 158.

The one or more pedestal electrodes may be configured to deliver RF energy to a plasma in the processing volume 120. For example, one or more RF sources may be provided outside of the chamber body 102 to provide RF energy to one or more pedestal electrodes in the pedestal 104. The RF energy may be transferred through the one or more pedestal electrodes to a gas in the processing volume 120 that is deposited through the gas distributor plate 112 (also referred to as a "showerhead") to generate a plasma. The plasma may be maintained above the substrate 154 to deposit a layer of material on the substrate 154. In order to uniformly deposit material on the substrate 154, the energy transferred to the plasma should be maintained uniformly across the surface area of the substrate 154. In this example, the one or more RF sources may include a low-frequency generator 153 and/or a high-frequency generator 159 that may be configured to deliver multiple frequencies to the pedestal electrodes 157, 158. Common frequencies found in the pedestal 104 may include 350 kHz, 13.56 MHz, 27.12 MHz, 40.68 MHz, and/or the like.

In some embodiments, an RF filter box 133 may be included between the heater control 155 and the one or more heating elements 139. The RF filter box 133 may be configured to perform a number of functions. For example, the RF filter box 133 may include a network of components, such as inductors 151, 152 to prevent the RF power delivered by one RF source from reaching another. Some embodiments may also include an ESC P/S and FILTER 195. In normal operation, the RF power is transmitted through the RF filter box 133 to the wire meshes of the pedestal electrodes 157, 158. From the pedestal electrodes 157, 158, the RF power may pass through the gas in the chamber to form the plasma. The RF power may then pass through the electrode 108, traveling through the chamber body 102 and the shaft 144 into the return path of the RF filter box 133. The RF power may then complete the circuit back to the one or more RF sources.

In some embodiments, the RF filter box 133 may be a distinct component in the processing chamber system. For example, the RF filter box 133 may include a housing with connectors that receive the leads from the heater control and/or the heater element(s) in the pedestal. The housing may enclose the filter circuit, which may include the inductors, capacitors, and resonant circuit described below.

In addition to the one or more pedestal electrodes 157, 158, some embodiments may also include one or more heating elements 139 in the pedestal 104. The one or more heating elements 139 may include wires with a relatively low internal resistance that generate heat when an electrical current is run through the one or more heating elements 139. For example, some heating elements may have a resistance of less than 10 ohms, such as 2 ohms. Power may be provided to the one or more heating elements 139 by a heater control 155. The heater control 155 may provide voltage/current to the one or more heating elements 139 during a processing cycle to heat the pedestal 104. This heat may be transferred to the substrate 154 to bring the substrate 154 into a predetermined temperature range during the process.

In addition to providing the input for the one or more RF sources, the RF filter box 133 may prevent RF signals from leaking into the heater control 155 and also present a high impedance to the RF for that path. For example, the RF power provided to the pedestal electrodes 157, 158 may readily couple with the AC elements of the heating element(s) 139 through the dielectric. To minimize the RF power that is diverted away from the plasma, the RF filter box 133 may include a plurality of inductor/capacitor combinations for each input and/or output lead to/from the heater control 155. For example, each individual RF filter in the RF filter box 133 may include a series capacitor (e.g., approximately 50 nF) and inductor (e.g., approximately 6 µH) to filter out RF signals on each of these lines. This combination of inductances and/or capacitances may be configured to generate a resonant peak with a high impedance at a particular high frequency while still allowing low frequencies to pass.

According to this arrangement, there may be a number of leads that run through the RF filter box. For example, RF leads may run up the shaft 144 to the pedestal electrodes 157, 158. Additionally, each heater zone in the pedestal 104 may be connected to a power lead and a return lead. Traditional pedestals typically used two heating zones, such as an inner zone and an outer zone, resulting in four leads (e.g., two power leads and two return leads) running through the RF filter box 133. However, some embodiments may also be configured to use pedestals with many more heating zones, which complicates the RF filter box 133 as described below.

Figure 2A:
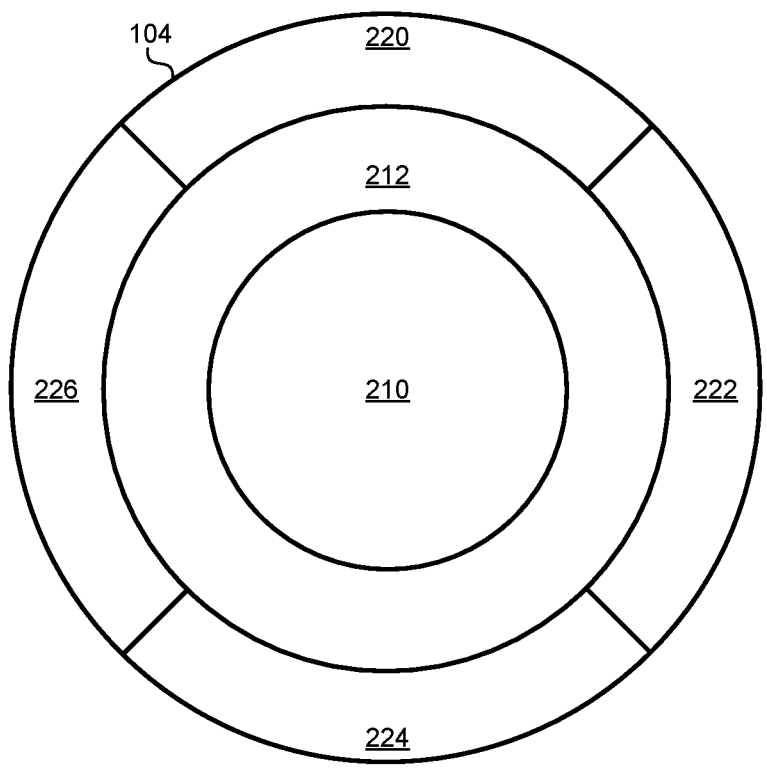
FIGS. 2A-2B illustrate a pedestal with a plurality of heating elements arranged into different heating zones, according to some embodiments.
Figure 2B:
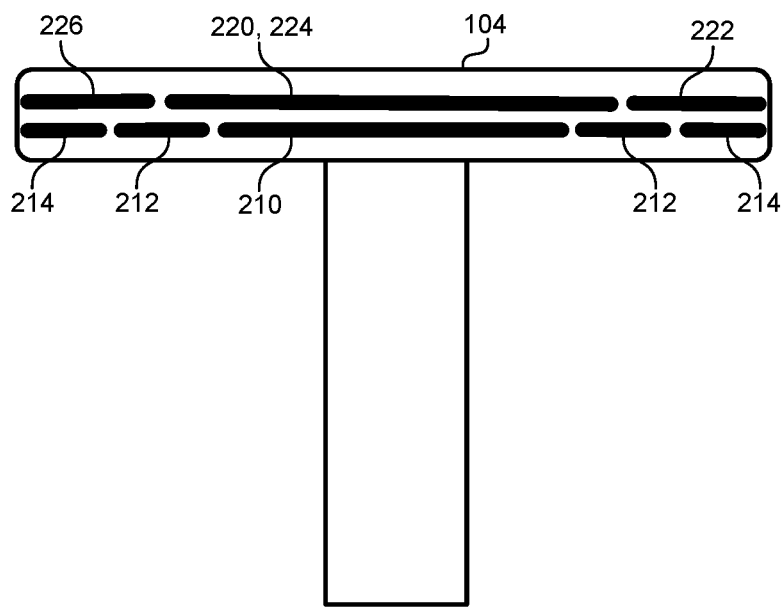

FIGS. 2A-2B illustrate a pedestal 104 with a plurality of heating elements arranged into different heating zones, according to some embodiments. In this example, the plurality of heating elements may include seven separate and distinct heating elements. Note that this arrangement and the number of heating elements is provided only by way of example and is not meant to be limiting. The heater control described herein may be used with any number of heating elements. Furthermore, the heating control may be compatible with different arrangements of heating element types. As described below, the heater control may include leads that are compatible with high-power heating elements and low-power heating elements interchangeably.

In this example, the pedestal 104 may include a number of high-powered heating elements that are arranged in concentric circular areas radiating outward from a center of the pedestal 104. A center or inner heating element 210 may have a disk or circular shape and be centered in the pedestal 104. A middle heating element 212 may have a ring shape and may be positioned concentrically around the inner heating element 210. An outer heating element 214 may also have a ring shape and may be positioned concentrically around the middle heating element 212. These heating elements 210, 212, 214 may be configured to receive current from the heater control such that they can generate heat in the kilowatt range. These heating elements 210, 212, 214 may be used to set the primary temperature of the substrate. For example, to heat the substrate to temperatures of around 300° C. to around 800° C., the processing chamber may rely on these heating elements 210, 212, 214 with higher power ranges to provide the primary heat for heating the substrate to this temperature range.

This example may also include a number of low-power heating elements that are arranged around a periphery or perimeter of the pedestal 104. The periphery of the pedestal 104 may be divided into quadrants, and a heating element may be located and shaped to cover each of the quadrants. For example, heating element 220, heating element 222, heating element 224, and heating element 226 may be arranged around the periphery. These heating elements may be arranged in a ring that may be similar in diameter to the outer heating element 214. In the cross-sectional view of the pedestal 104, these low-power heating elements 220, 222, 224, 226 may be placed on top of the high-power heating elements 210, 212, 214, or vice versa. The low-power heating elements 220, 222, 224, 226 may be used to fine-tune the temperature profile in specific areas of the pedestal 104. Note that the specific geometry and arrangement of the low-power heating elements 220, 222, 224, 226 are provided only by way of example and are not meant to be limiting. The low-power heating elements 220, 222, 224, 226 may use power that is less than 100 W, such as between approximately 10 W and approximately 40 W. Other embodiments may include more or fewer low-power heating elements, which may be located in any of the middle, inner, and/or outer regions of the pedestal 104.

In some embodiments, seven heater zones may require a power lead and a return lead for each zone, resulting in a large number of leads running through the RF filter box. Each of the heating elements may be modeled as a wire with an internal resistance that generates heat in the pedestal 104. Therefore, basic implementations may use a power and return wire for each of the heating element. In the example above using seven distinct heating element, this would result in 14 different leads going to/from the pedestal 104 for the heating elements alone, along with at least two more leads for the DC chucking voltage and/or the RF power delivered to the pedestal electrodes.

Figure 3:
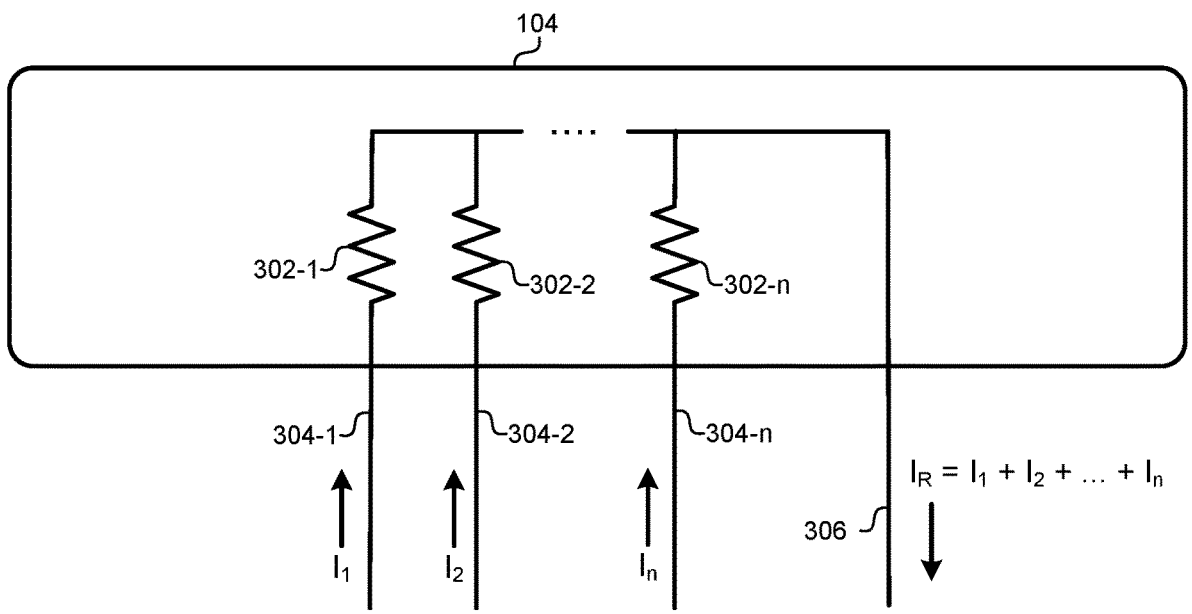
FIG. 3 illustrates a circuit for combining return leads for different heating elements, according to some embodiments.

FIG. 3 illustrates a circuit for combining return leads for different heating elements, according to some embodiments. In this example, the high-power heating elements in the inner, middle, and outer sections of the pedestal 104 may be modeled as resistances 302 in a circuit diagram. The resistances 302 may be connected to the heater control through a plurality of power leads 304. In order to individually control each of the heating zones, each of the resistances 302 may be individually associated with one of the power leads 304. For example, power lead 304-1 may be used to deliver current to resistance 302-1 for the inner heating element, power lead 304-2 may be used to deliver current to resistance 302-2 for the middle heating element, and power lead 304-n may be used to deliver current to resistance 302-n for the outer heating element.

While each of the resistances 302 may be associated with individual wires in the power leads 304, each of these resistances 302 may also be associated with a shared return lead 306. Sharing a return lead improves the processing chamber by minimizing the number of electrical leads that need to be routed through the pedestal 104 and filtered from other RF/DC signals in the pedestal 104. However, when multiple heating zones share the same return lead 306, this may increase the instantaneous current that is routed through the return lead 306. As described below, this current may be filtered through an inductor and other circuit elements to remove RF signals that may be present in the pedestal 104. An excessive amount of current may overheat the inductor and other circuit elements and damage or degrade the operation of the processing chamber, so the power provided through each power lead 304 may be duty cycle to prevent excessive current. An example of a heater control configured to control a seven-zone pedestal using nine leads is described in the commonly assigned U.S. patent application Ser. No. 17/167,904, filed on Feb. 4, 2021 entitled "Multi-zone Heater Control for Wafer Processing Equipment," which is incorporated by reference herein in its entirety.

Turning back to FIGS. 2A-2B, the plurality of leads may be combined into two groups: one group of three power wires and one shared return wire for the high-power heating elements, and one group of four power wires and one shared return wire for the low-power heating elements, which reduces the total number of wire leads down to nine wire leads for the heater. The RF filter box 133 may be provided to filter the RF signals that may be present in the pedestal 104. As described above, the pedestal 104 may also include multiple wire meshes that provide RF power to a plasma in the processing chamber. To prevent the RF signal from traveling down the leads 303 and into the heater control 300, the RF filter box 133 may be configured to remove RF signals in the frequency range of the pedestal 104. The RF filter box 133 may also be configured to remove low-frequency signals and provide a low, stable resistance for DC voltages that are applied to the heating elements. For example, the RF filter box 133 may remove common frequencies found in the pedestal 104, such as 13.56 MHz, 27 MHz, 40 MHz, and so forth.

A technical problem exists when trying to accommodate individual filters for a large number of heater leads, such as each of the nine leads used in a seven-zone pedestal. Specifically, the relatively large inductors used for each lead are difficult to accommodate in the physical space of the RF filter box 133. In order to accommodate individual filters on each lead running to/from the heater control, some embodiments described herein solve this technical problem by introducing a resonant circuit that can be shared amongst the filter circuits on the heater control leads as they grow in number. This reduces the size of the individual inductors needed on each heater zone lead, and thus allows the RF filter box to accommodate a larger number of heater zones in the pedestal. As described below, this also allows the filter box to generate targeted resonant frequencies corresponding to frequencies to be filtered from the heater leads.

Figure 4A:
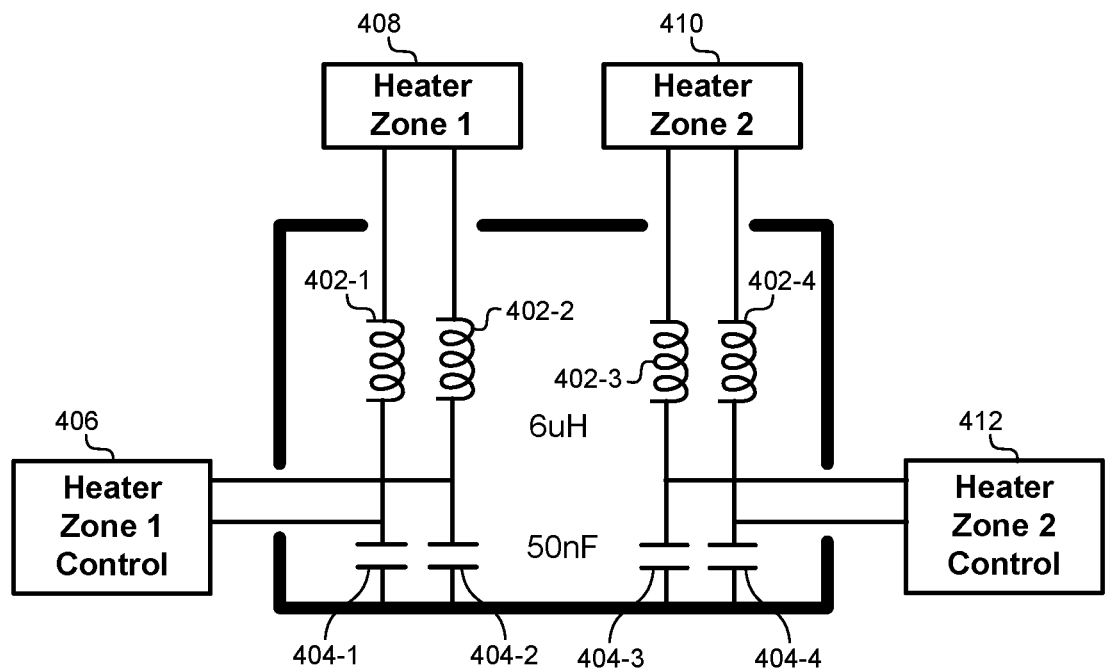
FIG. 4A illustrates an RF filter box for a pedestal having two heater zones, according to some embodiments.

FIG. 4A illustrates an RF filter box for a pedestal having two heater zones, according to some embodiments. Although only two heater zones are illustrated in FIG. 4A for clarity, other embodiments may use the same principles to accommodate any number of heater zones and/or leads. Typically, heater zone controls 406, 412 may be connected to leads for each heater zone 408, 410. The heater zone controls 406, 412 may provide power with a relatively low frequency, such as 60 Hz, 50 Hz, or even DC signals. These frequencies may be very low compared to the relatively high frequencies provided to the plasma through the RF generators. For example, the frequency of the signal provided from the heater zone controls 406, 412 may be at least one or two orders of magnitude less than the frequency of the RF power provided to the pedestal electrodes.

Figure 4B:
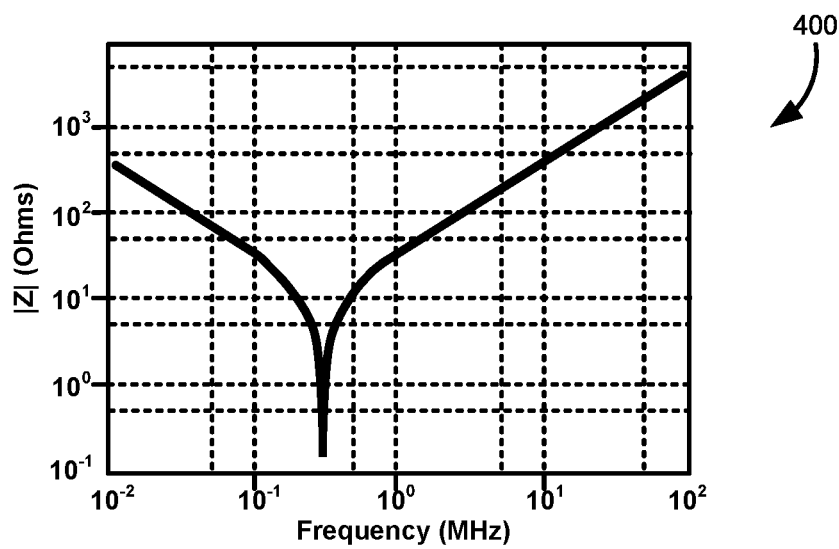
FIG. 4B illustrates a frequency response of the circuit in FIG. 4A. The impedance of the filter is illustrated as a function of frequency.

To allow the relatively low frequencies of the heater zone controls 406, 412 to pass through to the heater zones 408, 410, inductors 402 and capacitors 404 for each lead may be arranged to generate filtering frequencies that are configured to filter the higher RF power frequencies for the pedestal electrodes. In this example, inductors 402 (also referred to as lead inductors, heater inductors, heater lead inductors, or a plurality of such inductors) may be connected in series on each lead between the heater zones 408, 410 and the heater zone controls 406, 412. This may include inductors 402 on each power and return lead. In some embodiments, these inductors 402 may have a value of approximately 6.0 µH. Additionally, parallel capacitors 404 having a value of approximately 50 nF may be included in the filter box for each lead. These combinations of the inductors 402 and the capacitors 404 may be configured to generate a frequency response that passes the low frequency of the heater zone controls 406, 412 while attenuating the much higher frequencies generated for the pedestal electrodes. FIG. 4B illustrates a graph 400 of a frequency response of the circuit in FIG. 4A, with the impedance looking into the filter box from the perspective of the heater zones. The impedance of the filter is illustrated as a function of frequency. The lower frequencies of the heater may be subject to a very low impedance, while the 6.0 µH inductor may generate a response configured to generate a high impedance (e.g., 500 ohms or more) at 13.56 MHz and above as illustrated.

Figure 5A:
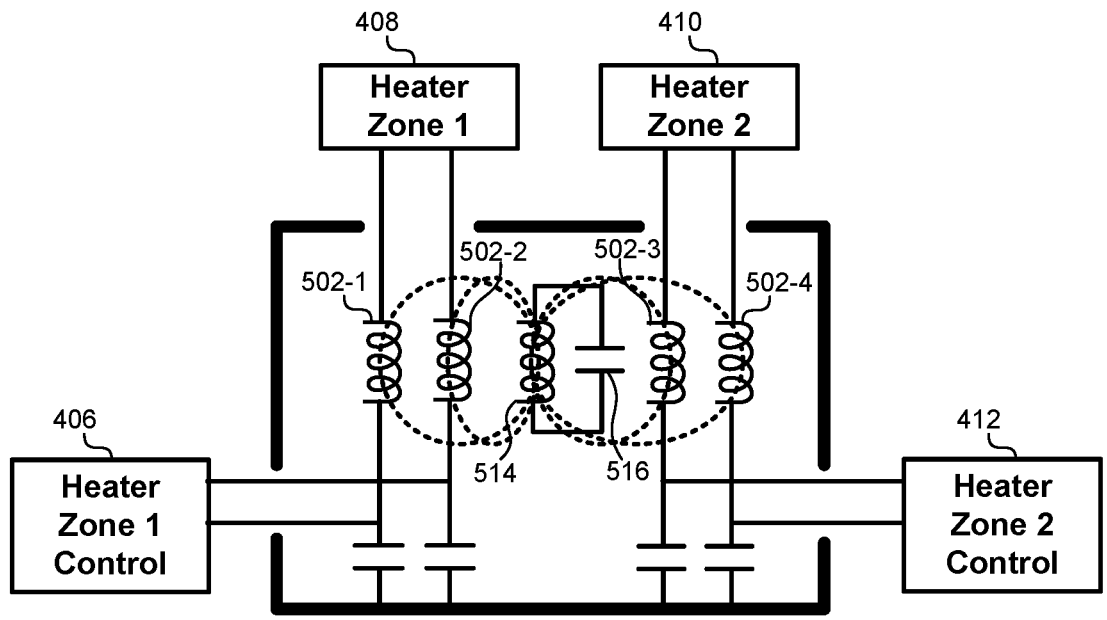
FIG. 5A illustrates a resonant circuit that is magnetically coupled to the lead inductors for the heater controls, according to some embodiments.

FIG. 5A illustrates a resonant circuit that is magnetically coupled to the lead inductors for the heater controls, according to some embodiments. A resonant circuit may include a resonant inductor 514 and a resonant capacitor 516. The resonant inductor 514 may be magnetically coupled to the lead inductors 502 connected to each of the leads between the heater zone controls 406, 412 and the heater zones 408, 410. This allows the lead inductors 502 to be reduced in size and share the effect of the resonant inductor 514, thus shrinking the overall size of the filtering circuits that need to fit inside the RF filter box.

Through the magnetic coupling, the resonant inductor 514 and the resonant circuit may be shared amongst the heater leads in the RF filter box. The resonant inductor 514 may be connected in series with the resonant capacitor 516. The resonant circuit may be electrically isolated from the heater leads and/or other inductors 502 in the filter box such that current does not flow directly from the resonant circuit through the heater leads or inductors 502.

Figure 5B:
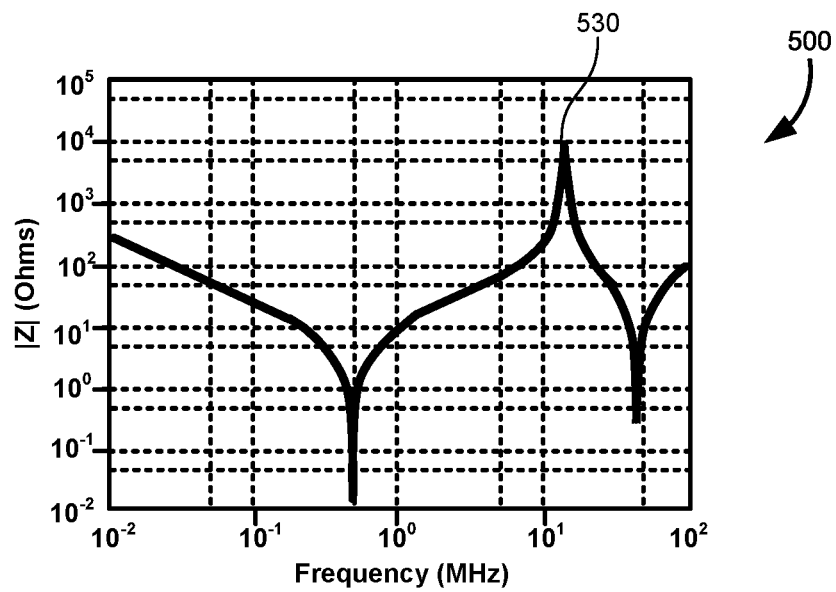
FIG. 5B illustrates the impedance of the filter of FIG. 5A as a function of frequency.

FIG. 5B illustrates a graph 500 of the impedance of the filter of FIG. 5A as a function of frequency, as found by looking into the filter box from the perspective of the heater zones. The resonant circuit introduces a resonant peak 530 at approximately 13.56 MHz with a 0.5 µH inductor used for the resonant inductor 514 and a 250 pF capacitor used for the resonant capacitor 516 as examples. This allows the 6.0 µH size of the inductors 502 to be reduced down to approximately 2.0 µH. At 13.56 MHz, the filter may generate an impedance of greater than 1500 ohms. Not only does the resonant circuit allow the component sizes to be reduced for the inductors 502, but it increases the impedance of the filter at the desired RF frequency. Thus, the resonant circuit allows the filters on each lead to fit within the physical volume of the filter box, and increases the effectiveness of the filter circuit in preventing RF power from the pedestal electrodes from leaking back down the heater leads.

Note that these frequencies and inductance/capacitance values are provided only by way of example for filtering a 13.56 MHz RF signal provided to the pedestal electrodes. As described below, additional resonant circuits may be added to the filter box to introduce additional resonant peaks at the other RF frequencies that may be present in the RF filter box.

For example, given the frequency generated by the high-frequency RF generator, one having skill in the art may select component values for the resonant inductor 514 and the resonant capacitor 516, as well as the lead inductors 502 to generate a corresponding frequency response to filter the given frequency. In some implementations, the resonant peak 530 may be selected to coincide with the frequency of the high-frequency generator. The frequency generated by the low-frequency generator need not always require a corresponding resonant peak, as the low-frequency RF power is less likely to be coupled through the dielectric of the pedestal to the heater zone.

Figure 6A:
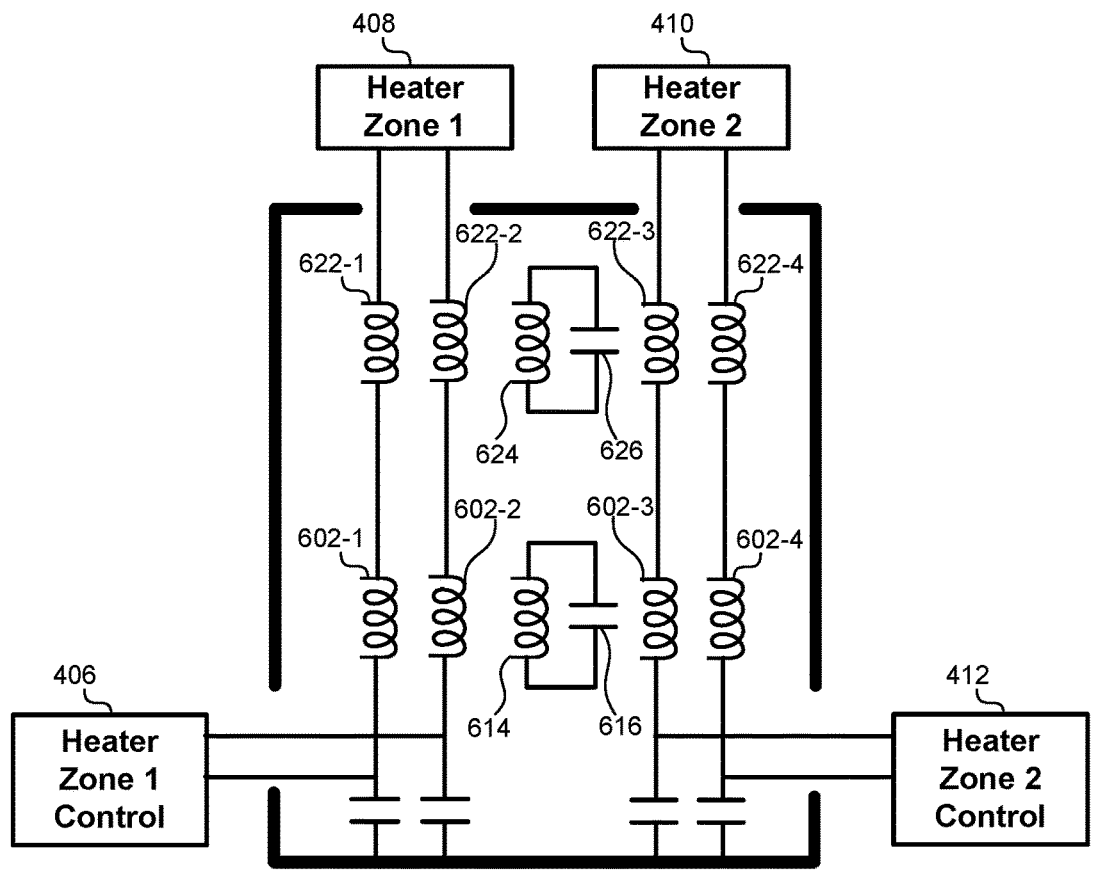
FIG. 6A illustrates a filter box with a plurality of resonant circuits, according to some embodiments.

FIG. 6A illustrates a filter box with a plurality of resonant circuits, according to some embodiments. In this implementation, a first resonant circuit may include a first resonant inductor 624 and a first resonant capacitor 626. The first resonant inductor 624 may be magnetically coupled to a first plurality of lead inductors 622. Similarly, a second resonant circuit may include a second resonant inductor 614 and a second resonant capacitor 616. The second resonant inductor 614 may be magnetically coupled to a second plurality of lead inductors 602. Multiple resonant circuits may be added to generate multiple resonant peaks at different frequencies. For example, multiple resonant peaks may be generated to filter the low-frequency generator, the high-frequency generator, and/or any other RF frequencies that may be present in the processing chamber. Including multiple resonant circuits may also allow the sizes of the lead inductors to be further reduced.

Figure 6B:
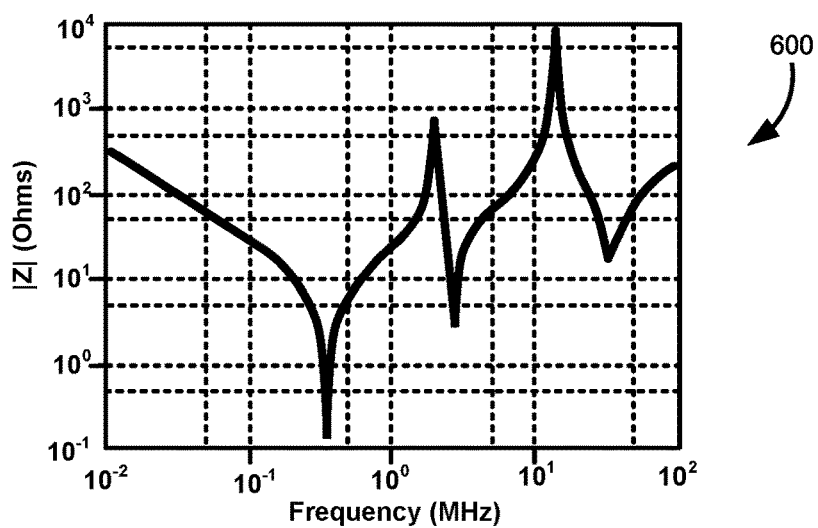
FIG. 6B illustrates the impedance of the filter of FIG. 6A as a function of frequency.

FIG. 6B illustrates a graph 600 of the impedance of the filter of FIG. 6A as a function of frequency, as found by looking into the filter box from the perspective of the heater zones. In this example, the first resonant circuit may include a 2.0 μH resonant inductor 624 and a 13 nF resonant capacitor 626, which may generate an impedance of approximately 800 ohms at 2 MHz. Additionally, the second resonant circuit may include a 2.0 μH resonant inductor 614 and a 250 pF resonant capacitor 616 to generate an impedance of approximately 1500 ohms at 13.56 MHz. Note that the use of two resonant circuits is provided merely by way of example and is not meant to be limiting. Other embodiments may add any number of resonant circuits in order to generate additional resonant peaks corresponding to RF frequencies to be filtered from the filter box, such as the 350 kHz that may be used to modulate the ion energy in the chamber, or VHF frequencies such as 20 MHz, 40 MHz, 60 MHz, etc.

Figure 7:
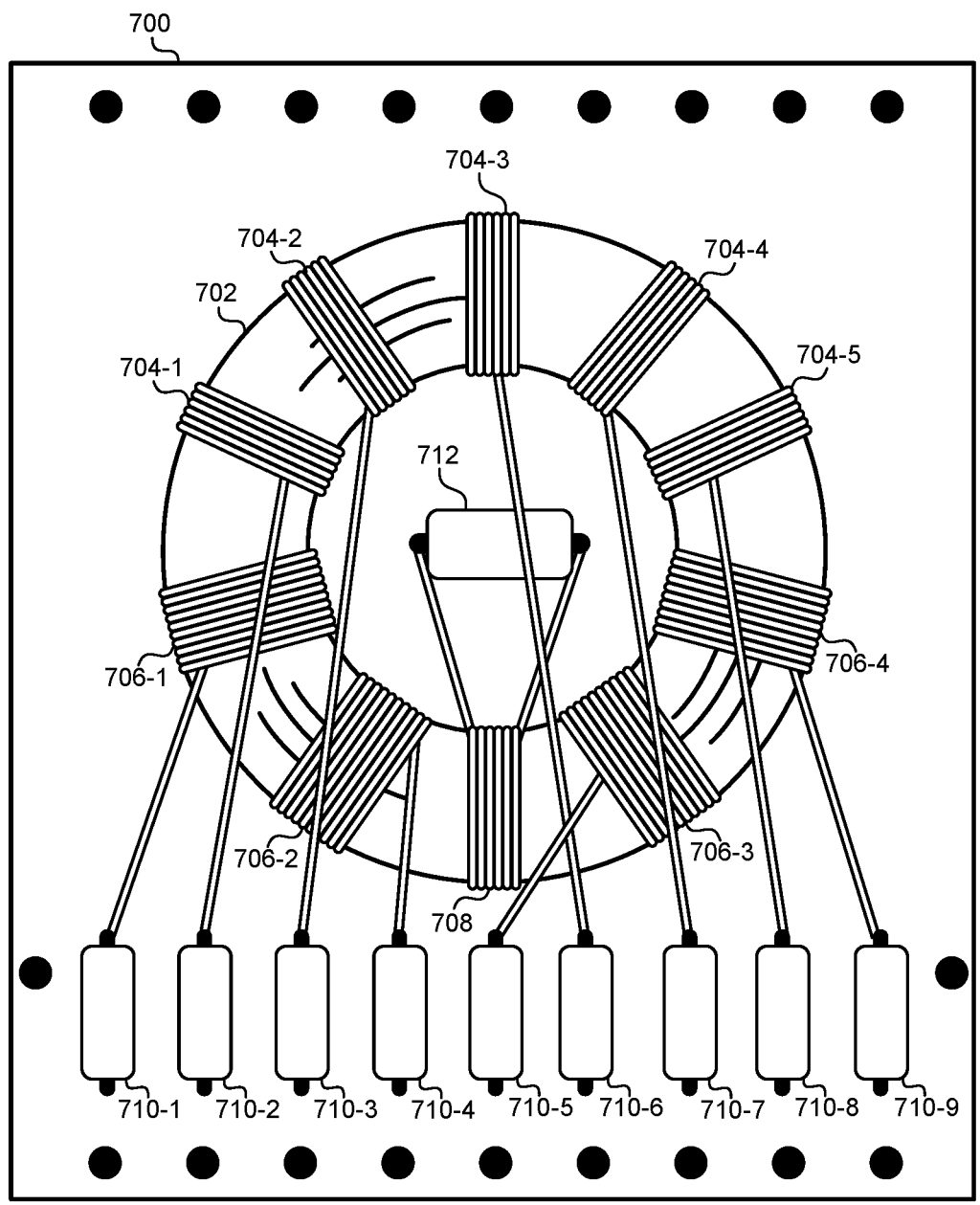
FIG. 7 illustrates one physical implementation of the resonant circuit, according to some embodiments.

FIG. 7 illustrates one physical implementation of the resonant circuit, according to some embodiments. The filter circuit may be mounted to a printed circuit board (PCB) 700 having, for example, approximate dimensions of 130 mm×140 mm. In order to strengthen the magnetic coupling between the resonant inductor 708 and the lead inductors 704, 706, a magnetic core 702 may be used. In this example, a ferrite core having a toroid shape may be used as the magnetic core 702. The resonant inductor 708 and the lead inductors 706 may be wrapped around the magnetic core 702. The magnetic field lines from one inductor will tend to travel along the magnetic core 702 into neighboring inductors. The toroid shape of the magnetic core 702 may generate a closed loop for the magnetic field lines such that the coupling between the resonant inductor 708 and the other lead inductors 706 may be propagated around the magnetic core 702. In this example, the magnetic core 702 may have an outer diameter of approximately 89 mm and an inner diameter of approximately 50 mm. The magnetic core 702 may stand approximately 51 mm high off of the PCB 700. Other examples may use different dimensions for the magnetic core 702 without limitation.

As described above, any component values may be used to tailor the resonant peaks generated by the resonant circuits in the frequency response of the filters on the heater leads. As one example, the following component values may be used to implement the configuration illustrated in FIG. 7. The magnetic core 702 may include a ferrite toroid, such as an example toroid having a 3.5 inch outer diameter, a 2.0 inch inner diameter, and a 2.0 inch total height. Inductors 704-1, 704-2, 704-3, 704-4, and 704-5 may include four turns of 12 gauge magnetic wire. Inductors 706-1, 706-2, 706-3, and 706-4 may include four turns of 8 gauge magnetic wire. The resonant inductor 708 may include one turn of 8 gauge magnetic wire. The resonant capacitor 712 may include a 300 pF ceramic capacitor, and the lead capacitors 710 may include 47 nF film capacitors. These component values are provided only as one enabling embodiment and are not meant to be limiting.

Figure 8:
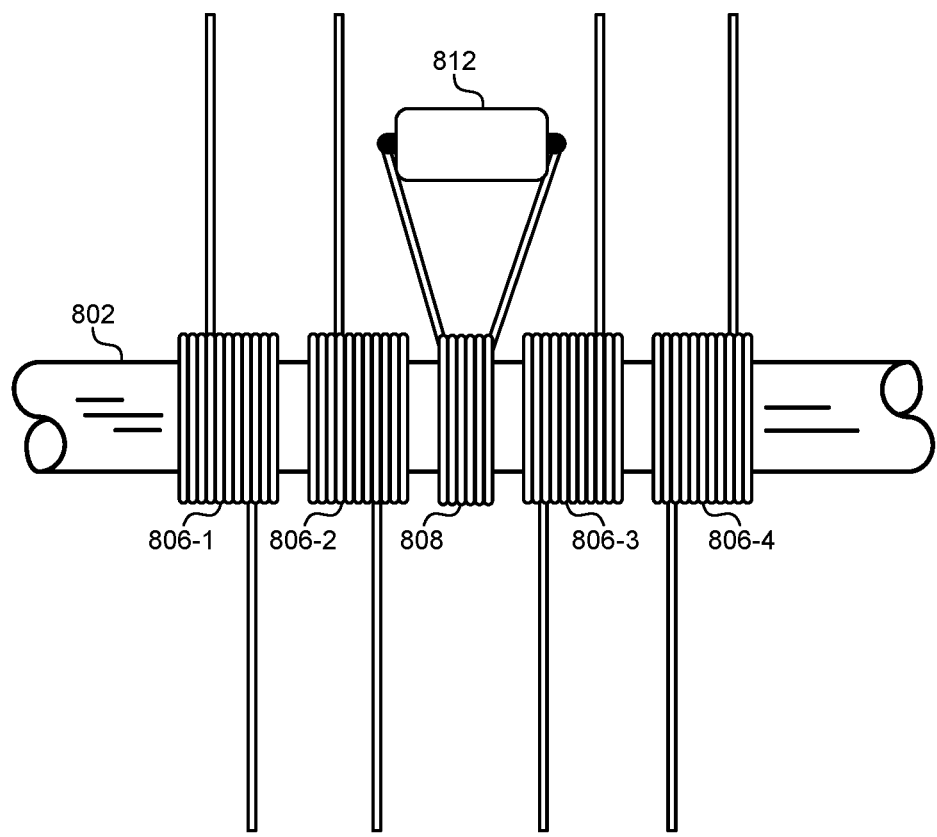
FIG. 8 illustrates an alternative implementation using a magnetic core, according to some embodiments.

FIG. 8 illustrates an alternative implementation using a magnetic core, according to some embodiments. In contrast to the implementation illustrated in FIG. 7, some embodiments may use a magnetic core 802 having a shape of a ferrite rod. The ferrite rod may be substantially straight. This linear arrangement may serve as an alternative to the toroid shape discussed above. In contrast to the toroid shape, the linear shape of the magnetic core 802 may allow magnetic field lines to leak out of the magnetic core 802. Thus, the strength of the magnetic coupling of the lead inductors 806 to a resonant inductor 808 may diminish towards the ends of the magnetic core 802.

For example, FIG. 8 illustrates a circuit with two power leads and two return leads, resulting in a total of four lead inductors 806 in the filter box. The resonant circuit may include the resonant inductor 808 and a resonant capacitor 812. The resonant inductor 808 may be more magnetically coupled to the lead inductors 806-2, 806-3 that are directly adjacent to the resonant inductor 808 then to lead inductors 806-1, 806-4 that are not adjacent to the resonant inductor 808. Lead inductors 806-1, 806-4 may use additional turns or windings to increase the magnetic coupling with the resonant inductor 808.

Figure 9:
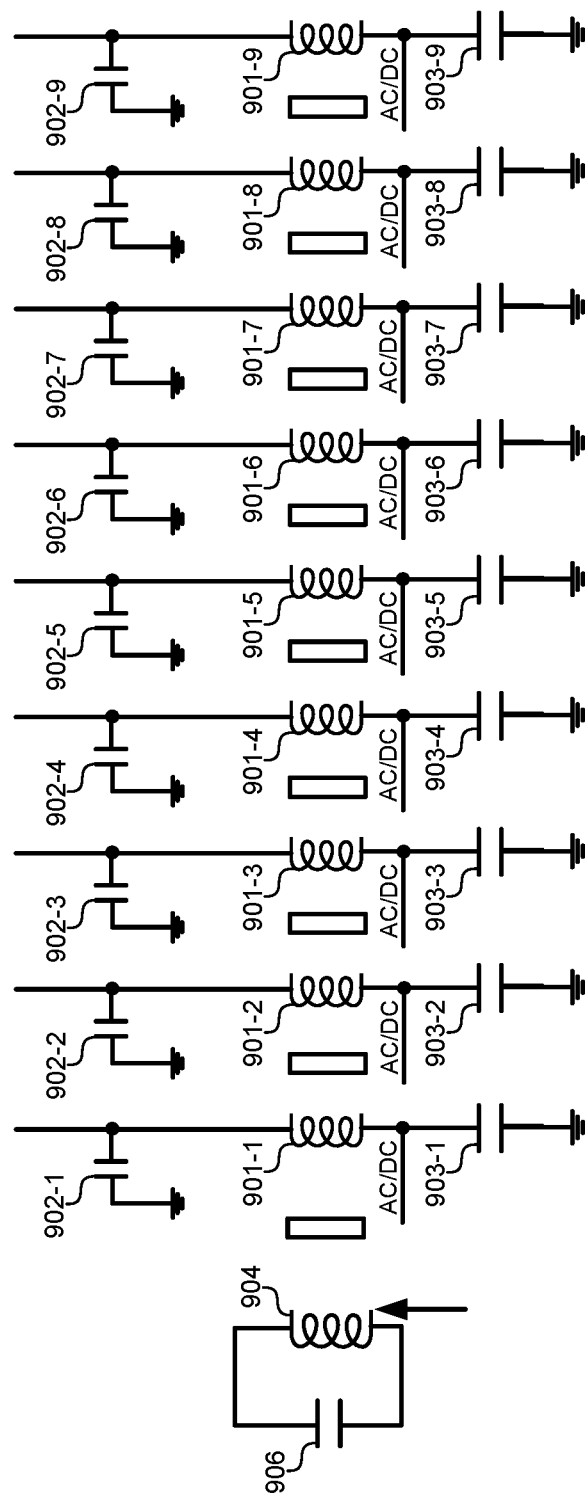
FIG. 9 illustrates a simplified circuit diagram of the implementation of the filter box, according to some embodiments.

FIG. 9 illustrates a simplified circuit diagram of the nine-lead implementation of the filter box, according to some embodiments. The resonant circuit may include a resonant inductor 904 and a resonant capacitor 906 connected in series to generate a resonant peak frequency. The resonant inductor 904 may be magnetically coupled to the lead inductors 901 on each of the leads routed to/from the heater zones in the pedestal. The parasitic capacitances 902 model the parasitic capacitance (e.g., approximately 2 pF) of a connector between the leads and the filter box, while the lead capacitances 903 provide a pathway to ground. By way of example, the resonant inductor 904 may have a value of approximately 0.5 μH and the lead inductors 901 may have values of approximately 2.0 μH. The resonant capacitance 906 may have a value of approximately 250 pF, and the lead capacitances may have values of approximately 50 nF.

Figure 10:
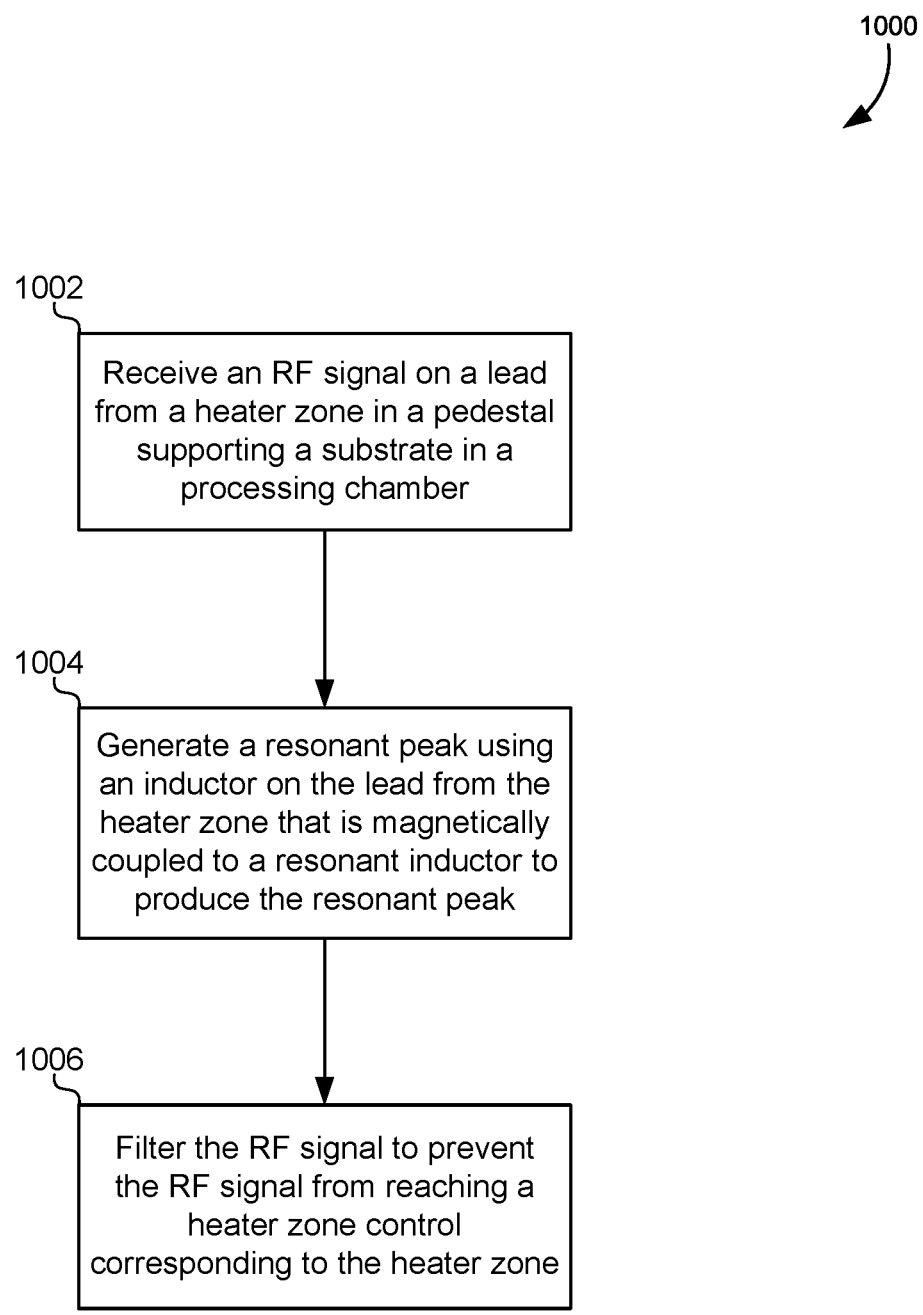
FIG. 10 illustrates a method of filtering plasma RF signals from heater zone leads in a semiconductor processing chamber for processing semiconductor substrates, according to some embodiments.

FIG. 10 illustrates a flowchart 1000 of a method of filtering plasma RF signals from heater zone leads in a semiconductor processing chamber for processing semiconductor substrates, according to some embodiments. This method may be executed by the circuit components described in any of the preceding figures. For example, this method may be executed by a filter box that is connected to leads running to/from a pedestal. However, these functions may also be carried out by any electronic components capable of performing these functions, and thus this method need not be limited to being performed by the circuit elements described above, but instead may be performed by any circuits, processors, and/or electronic components capable of performing these functions.

The method may include receiving an RF frequency on a lead from a heater zone in a pedestal supporting a substrate in a processing chamber (1002). The RF frequency may be generated by an RF source and delivered to a wire mesh electrode in the pedestal to generate and/or control a plasma in the processing chamber. The RF frequency may include frequencies such as 13.56 MHz and other similar frequencies described herein. The RF signal may be leaked from a pedestal electrode into the heater element in the heater zone instead of being transmitted through the plasma as intended. The lead may include a power lead and/or a return lead running between a heater zone control and a heater zone in the pedestal. The heater zone control may generate a signal (e.g., an electrical current) having a frequency (e.g., 60 Hz) that is at least one order of magnitude lower than the RF frequency from the RF source received on the lead. This step may be executed as described in reference to any of the figures above.

The method may also include generating a resonant peak using an inductor on the lead from the heater zone that is magnetically coupled to a resonant inductor to produce the resonant peak (1004). As described above, the inductor may be connected in series on the lead in the filter box running between the heater zone and the heater zone control. This lead inductor may be magnetically coupled to the resonant inductor. The resonant inductor may be part of a resonant circuit comprising a resonant capacitor. The resonant circuit may generate the resonant peak that is incorporated into the frequency response of the overall filter circuit for the heater lead. The resonant circuit may include component values that generate a resonant peak that approximately matches the frequency of the leaked RF signal received on the lead. In some embodiments, the resonant inductor may be wound around a magnetic core, such as a ferrite core having a toroid or rod shaped. The magnetic core may be shared with the lead inductor and with other lead inductors in the filter box. This step may be executed as described in reference to any of the figures above.

The method may further include filtering the RF signal to prevent the RF signal from reaching a heater zone control corresponding to the heater zone (1006). The RF signal from the electrode may have a frequency that matches the resonant peak of the resonant circuit, and thus this RF signal may be attenuated before it reaches the heater zone control. This step may be executed as described in reference to any of the figures above.

It should be appreciated that the specific steps illustrated in FIG. 10 provide particular methods of filtering plasma RF signal from heater zone leads according to various embodiments. Other sequences of steps may also be performed according to alternative embodiments. For example, alternative embodiments may perform the steps outlined above in a different order. Moreover, the individual steps illustrated in FIG. 10 may include multiple sub-steps that may be performed in various sequences as appropriate to the individual step. Furthermore, additional steps may be added or removed depending on the particular applications. Many variations, modifications, and alternatives also fall within the scope of this disclosure.

In the foregoing description, for the purposes of explanation, numerous specific details were set forth in order to provide a thorough understanding of various embodiments. It will be apparent, however, that some embodiments may be practiced without some of these specific details. In other instances, well-known structures and devices are shown in block diagram form.

The foregoing description provides exemplary embodiments only, and is not intended to limit the scope, applicability, or configuration of the disclosure. Rather, the foregoing description of various embodiments will provide an enabling disclosure for implementing at least one embodiment. It should be understood that various changes may be made in the function and arrangement of elements without departing from the spirit and scope of some embodiments as set forth in the appended claims.

Specific details are given in the foregoing description to provide a thorough understanding of the embodiments. However, it will be understood that the embodiments may be practiced without these specific details. For example, circuits, systems, networks, processes, and other components may have been shown as components in block diagram form in order not to obscure the embodiments in unnecessary detail. In other instances, well-known circuits, processes, algorithms, structures, and techniques may have been shown without unnecessary detail in order to avoid obscuring the embodiments.

Also, it is noted that individual embodiments may have been described as a process which is depicted as a flowchart, a flow diagram, a data flow diagram, a structure diagram, or a block diagram. Although a flowchart may have described the operations as a sequential process, many of the operations can be performed in parallel or concurrently. In addition, the order of the operations may be re-arranged. A process is terminated when its operations are completed, but could have additional steps not included in a figure. A process may correspond to a method, a function, a procedure, a subroutine, a subprogram, etc. When a process corresponds to a function, its termination can correspond to a return of the function to the calling function or the main function.

The term "computer-readable medium" includes, but is not limited to portable or fixed storage devices, optical storage devices, wireless channels and various other mediums capable of storing, containing, or carrying instruction(s) and/or data. A code segment or machine-executable instructions may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc., may be passed, forwarded, or transmitted via any suitable means including memory sharing, message passing, token passing, network transmission, etc.

Furthermore, embodiments may be implemented by hardware, software, firmware, middleware, microcode, hardware description languages, or any combination thereof. When implemented in software, firmware, middleware or microcode, the program code or code segments to perform the necessary tasks may be stored in a machine readable medium. A processor(s) may perform the necessary tasks.

In the foregoing specification, features are described with reference to specific embodiments thereof, but it should be recognized that not all embodiments are limited thereto. Various features and aspects of some embodiments may be used individually or jointly. Further, embodiments can be utilized in any number of environments and applications beyond those described herein without departing from the broader spirit and scope of the specification. The specification and drawings are, accordingly, to be regarded as illustrative rather than restrictive.

Additionally, for the purposes of illustration, methods were described in a particular order. It should be appreciated that in alternate embodiments, the methods may be performed in a different order than that described. It should also be appreciated that the methods described above may be performed by hardware components or may be embodied in sequences of machine-executable instructions, which may be used to cause a machine, such as a general-purpose or special-purpose processor or logic circuits programmed with the instructions to perform the methods. These machine-executable instructions may be stored on one or more machine readable mediums, such as CD-ROMs or other type of optical disks, floppy diskettes, ROMs, RAMs, EPROMs, EEPROMs, magnetic or optical cards, flash memory, or other types of machine-readable mediums suitable for storing electronic instructions. Alternatively, the methods may be performed by a combination of hardware and software.

What is claimed is:

1. A semiconductor processing chamber for processing semiconductor substrates, the semiconductor processing chamber comprising:
   a pedestal to support a substrate, wherein the pedestal comprises:
      a plurality of heater zones to heat the substrate; and
      a wire mesh configured to deliver a Radio Frequency (RF) signal to a plasma in the processing chamber with the substrate;
   one or more heater zone controls configured to deliver current to the plurality of heater zones; and
   a filter circuit between the one or more heater zone controls and the plurality of heater zones, wherein the filter circuit comprises:
      a plurality of inductors on a plurality of leads from the plurality of heater zones;
      a resonant circuit comprising a resonant inductor that is magnetically coupled to the plurality of inductors, wherein the resonant circuit produces a resonant peak that filters the RF signal delivered to the wire mesh from the plurality of leads from the plurality of heater zones to prevent the RF signal from reaching the one or more heater zone controls
      a ferrite toroid magnetic core, wherein the plurality of inductors and the resonant inductor are wound around the ferrite toroid magnetic core;
      a plurality of capacitors each connected in series with the plurality of inductors and in parallel with a lead corresponding to the one or more heater zone controls; and
      a printed circuit board, wherein the plurality of inductors and the ferrite toroid magnetic core are wired to the printed circuit board with connections to the plurality of capacitors.

2. The semiconductor processing chamber of claim 1, wherein the resonant circuit further comprises a resonant capacitor in series with the resonant inductor that contributes to producing the resonant peak.

3. The semiconductor processing chamber of claim 1, wherein the plurality of heater zones comprises at least seven heater zones in the pedestal, wherein the at least seven heater zones comprise four heater zones around a perimeter of the pedestal and three concentric heater zones radiating from a center of the pedestal.

4. The semiconductor processing chamber of claim 3, wherein the plurality of leads from the plurality of heater zones comprises at least nine leads, a first lead in the at least nine leads corresponding to a first return lead shared by the four heater zones around the perimeter of the pedestal, and a second lead in the at least nine leads corresponding to a second return lead shared by the three concentric heater zones radiating from the center of the pedestal.

5. The semiconductor processing chamber of claim 1, wherein the filter circuit is part of a filter box that also receives the RF signal from one or more RF generators and provides the RF signal to the wire mesh.

6. The semiconductor processing chamber of claim 5, wherein the plurality of inductors and the resonant inductor are enclosed in the filter box.

7. The semiconductor processing chamber of claim 1, wherein the resonant inductor is magnetically coupled to each of the plurality of inductors individually such that the resonant circuit produces the resonant peak for each of the plurality of leads from the plurality of heater zones.

* * * * *